United States Patent
Moyer et al.

(10) Patent No.: US 9,448,942 B2
(45) Date of Patent: Sep. 20, 2016

(54) RANDOM ACCESS OF A CACHE PORTION USING AN ACCESS MODULE

(71) Applicants: William C. Moyer, Dripping Springs, TX (US); Jeffrey W. Scott, Austin, TX (US)

(72) Inventors: William C. Moyer, Dripping Springs, TX (US); Jeffrey W. Scott, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 242 days.

(21) Appl. No.: 13/690,888

(22) Filed: Nov. 30, 2012

(65) Prior Publication Data

US 2014/0052922 A1 Feb. 20, 2014

Related U.S. Application Data

(63) Continuation-in-part of application No. 13/589,580, filed on Aug. 20, 2012, now Pat. No. 9,092,622.

(51) Int. Cl.
| | |
|---|---|
| *G06F 12/08* | (2016.01) |
| *G11C 7/24* | (2006.01) |
| *G11C 5/14* | (2006.01) |
| *G11C 29/12* | (2006.01) |

(52) U.S. Cl.
CPC ....... *G06F 12/0864* (2013.01); *G06F 12/0802* (2013.01); *G11C 7/24* (2013.01); *G11C 5/14* (2013.01); *G11C 29/12* (2013.01); *Y02B 60/1225* (2013.01)

(58) Field of Classification Search
None
See application file for complete search history.

(56) References Cited

U.S. PATENT DOCUMENTS

| | | | |
|---|---|---|---|
| 5,073,891 | A | 12/1991 | Patel |
| 5,383,143 | A | 1/1995 | Crouch et al. |
| 5,673,388 | A | 9/1997 | Murthi et al. |
| 5,680,544 | A | 10/1997 | Edmondson et al. |
| 5,940,588 | A | 8/1999 | Kikinis |
| 6,105,155 | A * | 8/2000 | Cheng ................. G06F 11/1008 714/735 |
| 6,477,251 | B1 | 11/2002 | Szrek et al. |
| 6,601,197 | B1 | 7/2003 | Naritake |
| 6,678,853 | B1 | 1/2004 | Brummel |
| 6,724,894 | B1 | 4/2004 | Singer |
| 6,766,455 | B1 | 7/2004 | Ryan, Jr. |
| 6,807,646 | B1 | 10/2004 | Williams et al. |
| 6,983,407 | B2 | 1/2006 | Appinger et al. |
| 7,412,468 | B2 | 8/2008 | Butler |
| 7,472,224 | B1 | 12/2008 | Klass et al. |
| 7,555,787 | B2 | 6/2009 | Nadim et al. |

(Continued)

OTHER PUBLICATIONS

Final Office Action mailed Apr. 18, 2014 for U.S. Appl. No. 13/589,580, 27 pages.

(Continued)

*Primary Examiner* — David X Yi
*Assistant Examiner* — Rocio Del Mar Perez-Velez

(57) ABSTRACT

A data processing system having a first processor, a second processor, a local memory of the second processor, and a built-in self-test (BIST) controller of the second processor which can be randomly enabled to perform memory accesses on the local memory of the second processor and which includes a random value generator is provided. The system can perform a method including executing a secure code sequence by the first processor and performing, by the BIST controller of the second processor, BIST memory accesses to the local memory of the second processor in response to the random value generator. Performing the BIST memory accesses is performed concurrently with executing the secure code sequence.

20 Claims, 10 Drawing Sheets

(56) References Cited

U.S. PATENT DOCUMENTS

| | | | |
|---|---|---|---|
| 7,636,858 | B2 | 12/2009 | Khan et al. |
| 7,702,705 | B2 | 4/2010 | Suzuki |
| 7,778,413 | B2 | 8/2010 | Hwang |
| 7,853,012 | B2 | 12/2010 | Muserlian |
| 7,899,190 | B2 | 3/2011 | Gebotys |
| 8,341,476 | B1 * | 12/2012 | Peng et al. .................... 714/733 |
| 8,407,452 | B2 | 3/2013 | Yoshimi |
| 2002/0104052 | A1 | 8/2002 | Nolles et al. |
| 2004/0019798 | A1 | 1/2004 | Ishii |
| 2004/0078402 | A1 | 4/2004 | Butler |
| 2004/0199824 | A1 * | 10/2004 | Harter ............................ 714/30 |
| 2004/0230882 | A1 | 11/2004 | Huott et al. |
| 2005/0055596 | A1 | 3/2005 | Abe et al. |
| 2005/0265547 | A1 | 12/2005 | Strasser et al. |
| 2006/0107156 | A1 | 5/2006 | Lee et al. |
| 2006/0143390 | A1 * | 6/2006 | Kottapalli .................... 711/130 |
| 2006/0184987 | A1 | 8/2006 | Allen et al. |
| 2007/0047623 | A1 | 3/2007 | Eun et al. |
| 2007/0127431 | A1 | 6/2007 | Eun et al. |
| 2008/0263414 | A1 | 10/2008 | Saito et al. |
| 2009/0161722 | A1 | 6/2009 | Gorman et al. |
| 2009/0245013 | A1 | 10/2009 | Chandra et al. |
| 2009/0327664 | A1 * | 12/2009 | Yoshimi ........................ 712/221 |
| 2009/0327680 | A1 | 12/2009 | Dale et al. |
| 2010/0218059 | A1 | 8/2010 | Gangasani et al. |
| 2014/0132291 | A1 * | 5/2014 | Somachudan et al. .... 324/750.3 |

OTHER PUBLICATIONS

Notice of Allowance mailed Feb. 3, 2014 for U.S. Appl. No. 13,169,664, 19 pages.

Non-Final Office Action mailed Sep. 10, 2013 for U.S. Appl. No. 13/589,580, 31 pages.

Non-Final Office Action mailed Aug. 15, 2013 for U.S. Appl. No. 13/169,664, 17 pages.

U.S. Appl. No. 13/169,664 filed Jun. 27, 2011, entitled "Using Built-In Self Test for Preventing Side Channel Security Attacks on Multi-Processor Systems".

Agarwal, A. et al., "A Novel Fault Tolerant Cache to Improve Yield in Nanometer Technologies," IEEE Proceedings of the 10th International On-Line Testing Symposium 2004, Jul. 12-14, 2004, pp. 149-154.

Agnola, L. et al., "Self-Adaptive Mechanism for Cache Memory Reliability Improvement," IEEE 13th International Symposium on Design and Diagnostics of Electronic Circuits and Systems 2010, Apr. 14-16, 2010, pp. 117-118.

Benso, A. et al., "Online and Offline BIST in IP-Core Design," IEEE Design & Test of Computers, vol. 18, No. 5, pp. 92-99, Sep.-Oct. 2001, doi:10.1109/54.953276.

Li, Y. et al, "CASP: Concurrent Autonomous Chip Self-Test Using Store Test Patterns," 2008 Design, Automation and Test in Europe, Mar. 10-14, 2008, 6 pages.

Ramaswamy, S. et al., "Customizable Fault Tolerant Caches for Embedded Processors," IEEE International Conference on Computer Design 2006, Oct. 1-4, 2007, pp. 108-113.

Tehranipour, M.H. et al., "An Efficient BIST Method for Testing of Embedded SRAMs," 2001 IEEE International Symposium on Circuits and Systems, Jan. 2001, vol. 5, pp. 73-76.

Notice of Allowance mailed Apr. 24, 2015 for U.S. Appl. No. 13/589,580, 16 pages.

* cited by examiner

RANDOM ACCESS OF A CACHE PORTION USING AN ACCESS MODULE

CROSS-REFERENCE TO RELATED APPLICATIONS

The present application is a Continuation-In-Part of U.S. patent application Ser. No. 13/589,580, entitled "RANDOM TIMESLOT CONTROLLER FOR ENABLING BUILT-IN SELF TEST MODULE," filed on Aug. 20, 2012, the entirety of which is herein incorporated by reference. The present application is related to co-pending U.S. patent application Ser. No. 13/169,664, entitled "USING BUILT-IN SELF TEST FOR PREVENTING SIDE CHANNEL SECURITY ATTACKS ON MULTI-PROCESSOR SYSTEMS," filed on Jun. 27, 2011, the entirety of which is herein incorporated by reference.

FIELD OF THE DISCLOSURE

This disclosure relates generally to systems including electronic devices, and more particularly, to systems having cache memory.

BACKGROUND

Computing systems often require operations to be carried out in a secure manner. For embedded computing devices and for pervasive systems, security of operation is often desirable. To ensure operations and communications are secure, such systems employ cryptographic methods.

The implementation of such a cryptographic method must itself be secure. However, cryptographic methods are subject to attacks. One type of non-invasive attack on computing devices implementing cryptographic methods is known as a side-channel attack. A side channel attack is any attack on the computing device based on information gained from the physical implementation of the computing system, rather than using a brute force attack or exploiting a theoretical weakness in the cryptographic algorithms. For example, timing information, power consumption, electromagnetic leaks, and sound can be used to as sources of information that can be used to break a system.

A power consumption attack, for example, involves the monitoring of the power consumption of one or more components of a device while the device executes a cryptographic method. One example of a power consumption attack is a differential power analysis. The data derived from monitoring power consumption of the device, combined with some knowledge of the operations being carried out by the device, can be used to derive the secret information that is part of the cryptographic method.

BRIEF DESCRIPTION OF THE DRAWINGS

The present disclosure may be better understood with reference to the accompanying drawings.

The use of the same reference symbols in different drawings indicates identical items unless otherwise noted. The Figures are not necessarily drawn to scale.

DETAILED DESCRIPTION

A mechanism is provided for generating a random power profile of a computing device executing a secure operation in order to prevent a side-channel attack that uses power consumption information. The secure operation can be implemented using a data processor implemented as a state machine or as an instruction based data processor that implements code in a secure manner, e.g., executes secure code. By way of example, it is presumed that secure operations are implemented by executing secure code on a processor, such as an instruction-based processor.

According to an embodiment, in a computing device, which can be an integrated circuit die having two or more processors, a processor that is not executing secure code performs random accesses of local memory thereby obscuring power consumption due to the processor executing the secure code. According to an embodiment, the random accesses can occur during random periods of time during which built-in self-test (BIST) logic that accesses the memory has been enabled. The memory accesses obscure the power consumption of the processor executing the secure operation due to the variable power consumption of memory array access. According to another embodiment, the BIST module can be randomly enabled to aid in providing power fluctuations that obfuscate power consumption associated with execution of the secure operation. In addition to being randomly enabled, the BIST module can generate random data, random addresses, and random times for reads and writes to the memory to further obfuscate power consumption of the secure operation, which further prevents an attacker attempting to perform a power consumption side channel attack.

According to another embodiment, a computing device that can be an integrated circuit die having a single processor and a cache, can dedicate a portion of its cache to servicing random accesses by a random access generator, such as a BIST module, while the remaining portion of the cache is available to an execution unit of the processor to support caching of information accessed by the execution unit. Alternatively, each processor of a multi-processor device can dedicate a portion of its cache to being randomly accessed while continuing to execute instructions. Various embodiments of the present disclosure will be better understood with reference to FIGS. 1-13.

Figure 1:
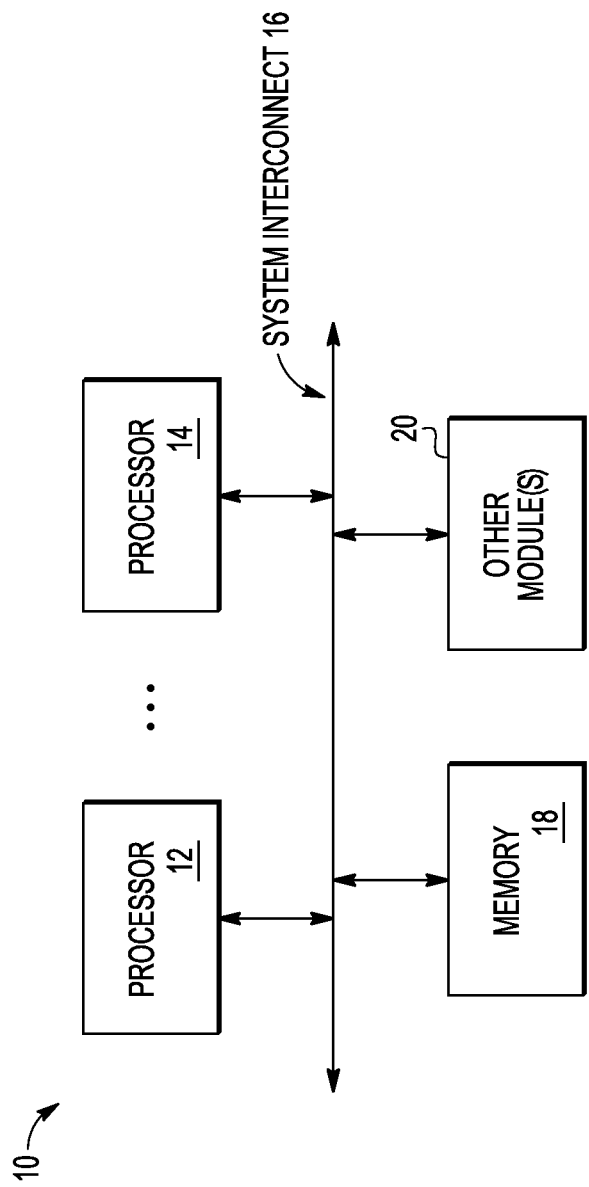
FIG. 1 is a simplified block diagram illustrating one example of a data processing system usable with embodiments of the present disclosure.

FIG. 1 is a simplified block diagram illustrating one example of a system device referred to herein as system 10 that includes a data processing system that includes processors 12 and 14 bidirectionally connected to a system interconnect 16. System interconnect 16 provides communication between the processors and memory 18 and other modules 20 (e.g., peripherals, input/output devices and the like). System interconnect 16 can be implemented in a variety of manners including as a system bus, as a cross-bar switch, or as other types of interconnect fabric. Memory 18 is bidirectionally connected to system interconnect 16 and can be any type of memory, such as, for example, read-only memory (ROM), random access memory (RAM), and the like. Other modules 20 are bidirectionally connected to the system interconnect 16 and may include any type and number of other modules, such as, for example, peripherals including input/output (I/O) devices, timers, memories, and the like.

Embodiments of the present disclosure may use more, less or different functional blocks than the units illustrated within system 10. Further, one or more of the functional blocks of system 10 may include an external port for communication external to system 10. In operation, processors 12 and 14, memory 18, and other modules 20 operate as known in the art of multiple processor systems. While system 10 is illustrated with two processors, alternate embodiments may include any plurality of processors, which may be the same, or may be different.

Figure 2:
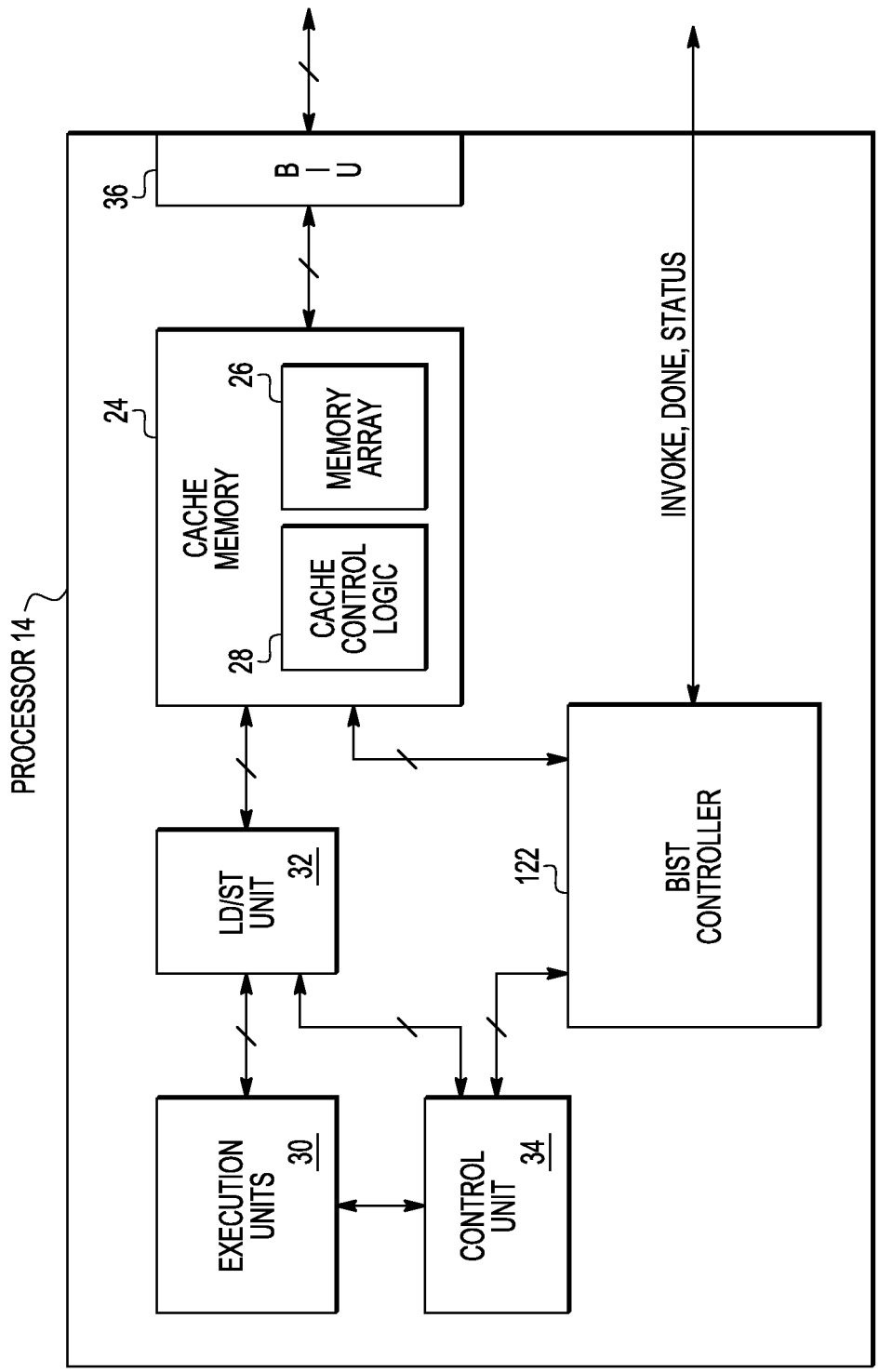
FIG. 2 is a simplified block diagram illustrating one example of a processor incorporating a BIST controller according to embodiments of the present disclosure.

FIG. 2 is a simplified block diagram illustrating one example of a processor 14 incorporating a BIST controller according to embodiments of the present disclosure. In particular, processor 14 includes a BIST controller 122 connected to a cache memory 24 that is local to processor 14. As will be discussed in greater detail below, BIST controller 122 is configured to perform both traditional BIST memory access functions related to memory testing (e.g., writing data to memory locations and comparing the stored data with the data written), as well as random BIST memory access functions that can be used to cause a random power profile during secure code operations by processor 12 of system 10 (e.g., writing random data to random memory locations (loading and storing) as well as reading data from random memory locations). It will be appreciated that while various cache accesses described herein are described as being implemented by the BIST controller 122, which includes features used to confirm proper operation of processor 12, the cache accesses can instead be implemented by other types of cache access modules, such as a random access generator, which is a cache access module that has the capabilities to generate and provide access requests as described herein. Such a cache access module does not necessarily have to have BIST features used in determining proper operation. According to an embodiment, processor 14 can be an instruction-based processor that includes one or more execution units 30 that can execute instructions. Execution units 30 are connected to load/store unit 32 that provides memory access operations to and from the execution units. Control unit 34 is connected to execution units 30, load/store unit 32 and BIST controller 122. Control unit 34 directs operations of components of processor 14.

Cache memory 24 includes a local memory array accessible to processor 14. According to an embodiment, the cache memory 24 is dedicated to supporting the processor 14, e.g., the cache memory 24 does not support caching for other processors. Cache memory 24 can represent separate data and instruction caches or be a unified memory. Cache memory 24 includes a memory array 26 that is configured to store data sequences in addressable data locations (e.g., cache lines). Cache control logic 28 provides access functions to the memory array. Cache memory 24 can have multiple cache ways. Cache control logic 28 interfaces with BIST controller 122 and load/store unit 32 to provide the access functions to the memory array. Communication to and from processor 14 is provided using bus interface unit (BIU) 36. BIU 36 can access instructions, and data operands for instructions, and the like. BIST controller 122 is configured for bidirectional communications with external devices. Such communications can include signals to invoke and stop BIST operations, status indications and the like.

Figure 3:
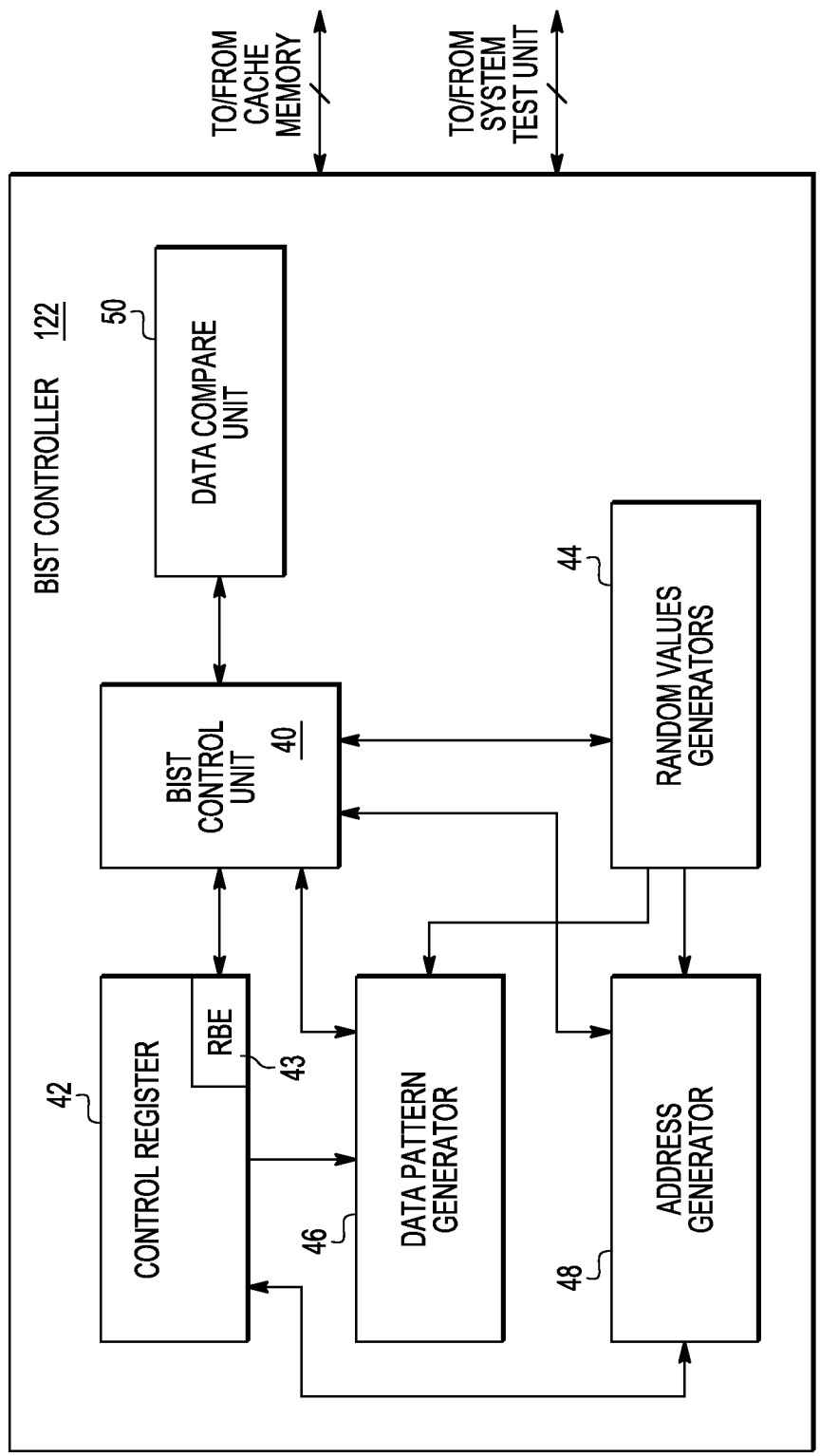
FIG. 3 is a simplified block diagram illustrating one example of a built-in self-test controller configured to implement embodiments of the present disclosure.

FIG. 3 is a simplified block diagram illustrating an embodiment (122) of BIST controller 122 of FIG. 2. BIST controller 122 includes a BIST control unit 40 that controls data flow operations of the BIST controller. Connected to the BIST control unit 40 is a storage module illustrated as a control register 42 that includes storage locations, including a storage location 43 that includes bit labeled RBE (random BIST enable). The RBE bit can be set by another processor that is executing a secure operation. For example, prior to, or contemporaneously with execution of a secure code sequence processor 12 can assert the RBE bit of processor 14 by write access to a memory mapped location of control register 42. Thus, processor 12 has storage access to the RBE bit. In addition, BIST control unit 40 of processor 14 can also access the RBE bit. In other embodiments, the RBE bit can be set by other means than the processor 14 (e.g., by another master having access to the control register comprising the RBE, by an asserted signal, by an interrupt signal, by processor 14 monitoring the state of processor 12, in response to a system event, and the like). In response to the RBE bit being set, the BIST control unit initiates a random BIST memory access as described herein.

The RBE bit is a mechanism for a processor executing a secure code sequence to inform a BIST module of this execution, e.g., by the processor executing secure code that sets the RBE bit, so that random BIST memory accesses can be performed by the BIST module. Alternatively, the first processor can inform the BIST module by providing a selected interrupt request to the second processor. In another alternative, the BIST module, or some other portion of the device, can determine whether the first processor is executing a secure code by monitoring access to memory locations of the secure code or data related to the secure code, and upon access by the first processor begin random BIST memory access. Subsequent to, or contemporaneously with, execution of the secure code, the BIST module can be notified to stop performing random BIST memory access. In a further alternative embodiment, the second processor can begin performing random BIST memory access in response to a system event.

A random value generator 44, connected to BIST control unit 40, generates random values usable by other components of BIST controller 122. The random value generator 44 can be implemented by a variety of random value generators known in the art, such as an LFSR (linear feedback shift register). Random values generated by random value generator are made available to data pattern generator 46, address generator 48 and BIST control unit 40, which are all connected to the random value generator. The term "random", and its variants, as used herein is intended to mean a true random number, a pseudo random number, or other number having a value unknown to a user.

Data pattern generator 46 can use a seed value, which can be a random value, to generate a random data pattern that is provided to BIST control unit 40 for storing to a memory location. The data pattern generator 46 is configured to perform both traditional BIST data pattern generation for BIST functions (e.g., pre-determined data values or data sequences, which can be based upon a known seed value) as well as the random BIST data pattern generation of embodiments of the present disclosure. Random seed values can be provided by random value generator 44 to data pattern generator 46 for each desired data pattern, or a previously generated random data pattern can be used as a seed for generating a next random data pattern, as desired for a particular implementation. Similarly, address generator 48 can use a random value generated by random value generator 44 as a seed to generate an initial random memory address that is provided to BIST control unit 40 for designating a memory location at which to perform a memory access. Subsequent random addresses can be generated using additional random values generated by random value generator 44 as a seed or using a previously generated random memory location as the seed. Address generator 48 is configured to perform both traditional BIST address generation for BIST testing as well as the random BIST address generation discussed above.

BIST control unit 40 uses an address generated by address generator 48 to store data generated by data pattern generator 46 in a location corresponding to the address of a memory local to the processor (e.g., memory array 26 of cache memory 24). Addresses and data values can either be values used for standard BIST memory testing or the random BIST data patterns and addresses generated by embodiments of the present disclosure. When writing standard BIST memory test values, data compare unit 50 is used to compare the values written with those stored in the memory (e.g., the value is read back from the memory location by BIST control unit 40 and compared by data compare unit 50). If the values do not match, this may indicate the presence of a defective memory cell. When writing the random BIST data of embodiments of the present disclosure, data compare unit 50 is not needed to determine whether the stored value is accurate since the purpose of this operation is not to test the memory but to utilize it for power consumption purposes.

Figure 4:
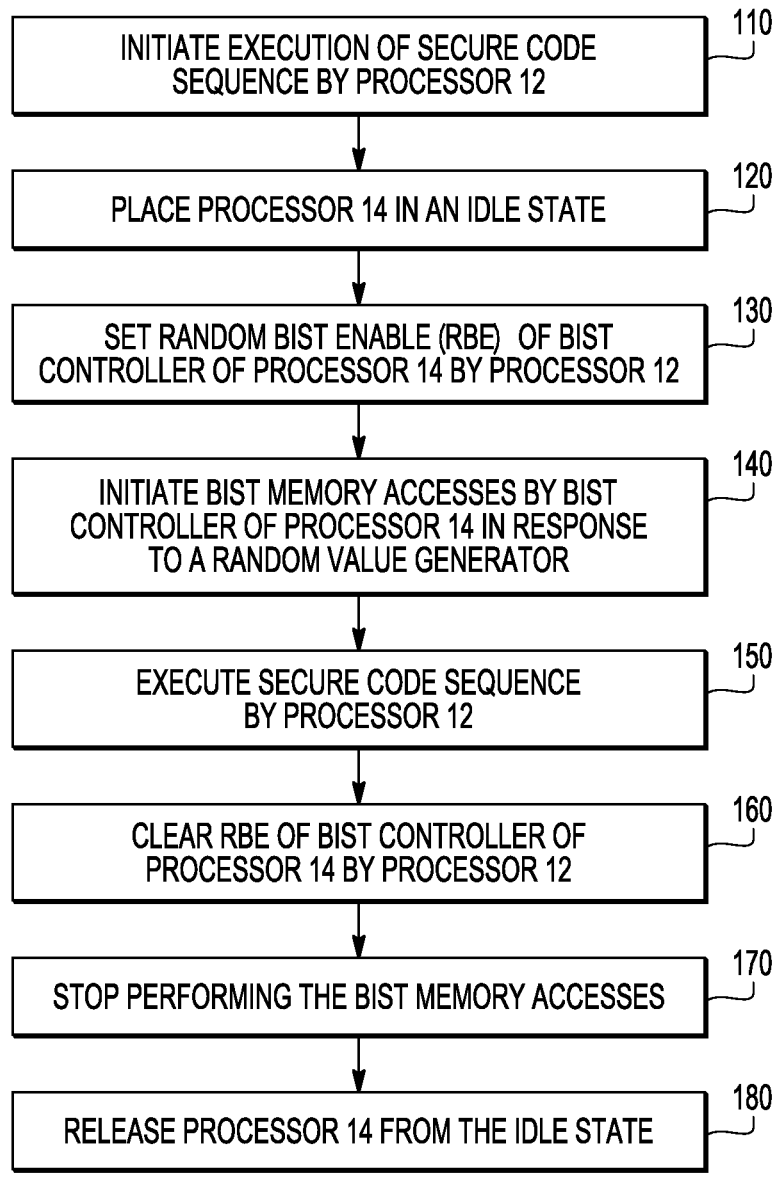
FIG. 4 is a simplified flow diagram illustrating a process for generating a random power consumption profile, according to an embodiment of the present disclosure.

FIG. 4 is a simplified flow diagram illustrating a process for generating a random power consumption profile, according to an embodiment of the present disclosure. The process begins with an initiation of execution of a secure code sequence by a first processor (e.g., processor 12) (110). Such a secure code sequence can include, for example, cryptographic code having crypto keys, and the like. As the processor performs initiation tasks, it is determined if a second processor (e.g., processor 14) be placed in an idle state, if necessary (as discussed below) (120). If the secure code sequence is performed by the first processor during, for example, boot sequence operations, then the second processor may already be idle and thus will not need to be actively placed in an idle state. On the other hand, should the secure code sequence be performed at a time when the second processor is performing other tasks, the second processor will be put into an idle state (e.g., interrupting current operations and storing current operational state information) in order to perform BIST-directed operations discussed below. According to embodiment, the first processor is responsible for determining whether the second processor is in an idle state, and for communicating with the second processor to effectuate a transition of the second processor to an idle state. Alternatively, the second processor can monitor activity of the first processor, and place itself in an idle state accordingly.

The first processor also sets a random BIST enable bit (RBE) in a control register of the BIST controller (e.g., storage location 43 of control register 42 of BIST controller 122) of the second processor (130). Assertion of the RBE enables the BIST controller 122 to perform random BIST operations (140). Random value generator 44 of the BIST controller 122 generates one or more random values that are used to generate random data patterns (e.g., by data pattern generator 46) and random memory addresses (e.g., by address generator 48). The random data patterns can be loaded or stored at the random data addresses of a memory local to the second processor (e.g., memory array 26 of cache memory 24). The generated addresses can indicate memory locations that are to be accessed, where the memory access can be a read access or a write access, e.g., load or store accesses, which can itself be determined randomly. Randomly selecting whether an access is a read access or a write access can aid in disguising power consumption since, in general, memory stores consume more power than a memory load. In addition, the BIST controller 122 can perform the loading/storing tasks at random intervals, determined by the BIST control unit 40 in response to random values generated by the random value generator 44. Varying the idle time in this manner can further randomize the power consumption profile of the computing device. The BIST controller 122 can also perform read accesses to random data addresses at random intervals, as provided, for example, in one embodiment discussed below. While the second processor 14 is performing the random BIST memory access, the first processor 12 proceeds with executing the secure code sequence (150).

Once the first processor has completed the secure code sequence, it is no longer necessary for the second processor to continue to perform random BIST memory accesses. The first processor can then clear the RBE of the second processor's BIST controller (160). In response to the clearing of the RBE, the second processor stops performing BIST memory access (170). The second processor is then released from the idle state, if necessary (180).

In one embodiment, the second processor may be requested to perform random BIST memory access immediately following a reset state of system 10. In this case, the local memory of the second processor typically contains no current information, and thus random BIST memory access may consist of a series of memory store operations which write random data values to random addresses. When completion of the secure code sequence by the first processor occurs, the second processor may be reset, and begin execution from a reset state.

In another embodiment, the second processor may be executing applications at the time it is requested to begin performing random BIST memory accesses, in conjunction with the first processor beginning execution of a secure code sequence. The second processor can be informed of such a request, for example, by an interrupt request generated by the first processor or by monitoring of the state of the RBE control bit for requests. In this situation, it will typically be desired for the second processor to temporarily interrupt execution of the application and to later continue with execution of the application once the first processor has completed execution of the secure code sequence. In this case, the second processor can be placed in an idle state, in which no instruction execution is performed (e.g., 120). Control is then given to BIST controller 122 for performing the random BIST memory accesses. Since the local memory contains information related to the ongoing execution of the second processor, the BIST controller may be controlled (or restricted) to only performing memory read operations for the random BIST memory accesses, and not performing memory write operations which would disturb the state of the suspended application. This embodiment contrasts with normal memory BIST operations in which a pattern of data is written to pre-determined memory locations and then read back for performing data value comparisons to ensure the proper operation of the memory storage locations. Since no modification of the memory locations are made, the second processor is able to resume execution of the interrupted (suspended) application once the first processor has completed the secure code sequence. No reset or invalidation of the local memory of the second processor is performed. Alternatively, the BIST controller 122, in response to RBE being set, can communicate with the memory being accessed, e.g., the cache memory, to save the contents of the cache memory before proceeding with random write accesses. This embodiment contrasts with normal memory BIST operation in that requesting a write-back of cache data to another storage location is not performed with respect to a normal BIST operation.

Figure 5:
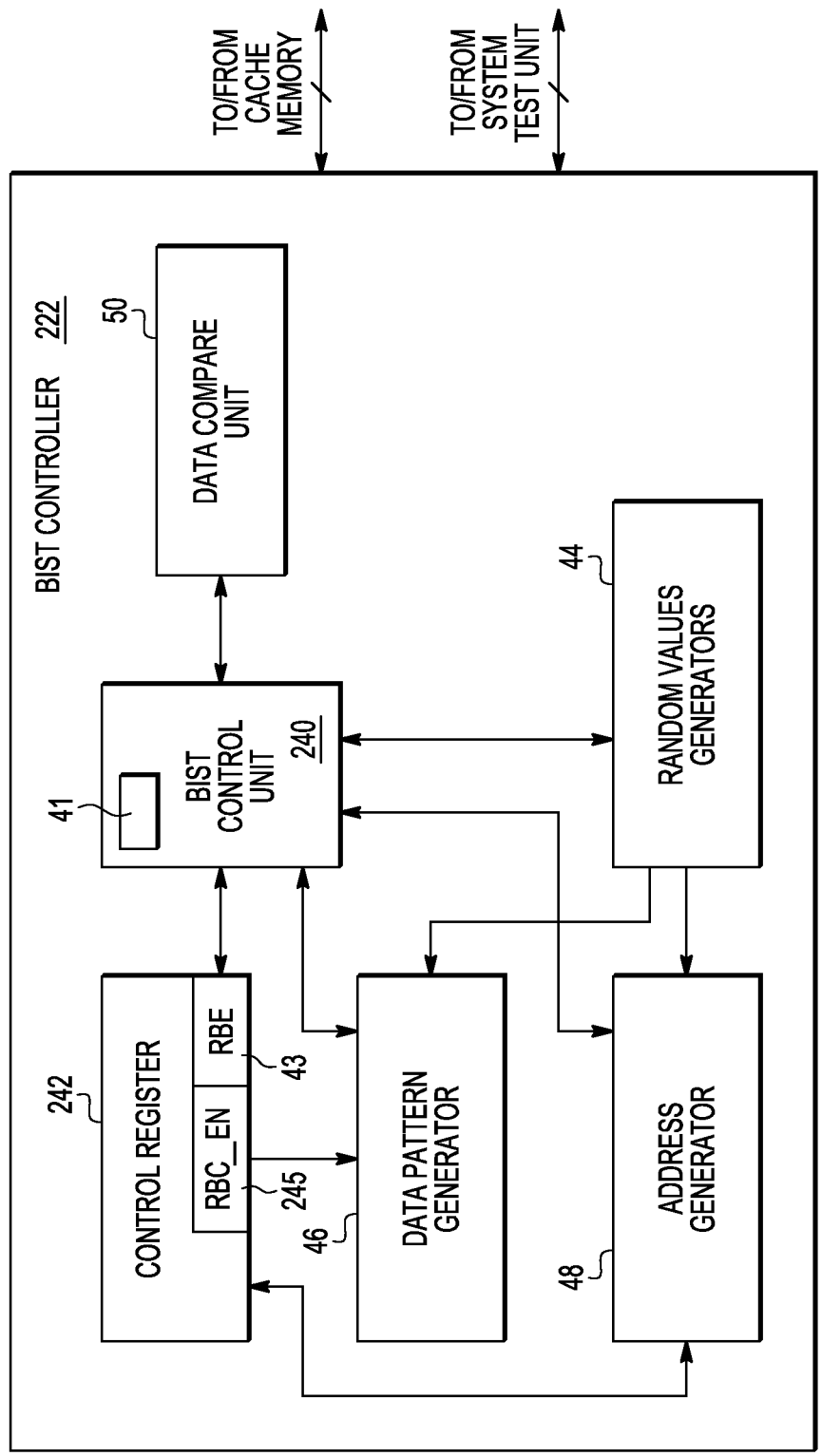
FIG. 5 is a simplified block diagram illustrating one example of a built-in self-test controller configured to implement embodiments of the present disclosure.

FIG. 5 is a simplified block diagram illustrating an embodiment 222 of BIST controller 122 that includes additional features that facilitate generating a random power pattern at integrated circuit die to help obfuscate power being consumed by a secure module. BIST controller 222 includes a BIST control unit 240 that is connected to a control register 242, a data pattern generator 46, an address generator 48, a random values generators 44, and a data compare unit 50, wherein modules of FIG. 5 that are identically numbered to modules of FIG. 3 can operate in the same manner as that previously described.

The control register 242 illustrated in FIG. 5 includes an extra storage location 245 where an additional control bit, labeled RBC_EN is stored. The control unit 240 is illustrated to include a module 41 that represents timeslot generator that randomly activate/deactivates the BIST controller 222 during random time slots that correspond to when timeslot generate 41 is providing an asserted signal. It will be appreciated, that the random number generation features of timeslot generator 41 can also reside within the random values generator module 44.

During traditional operation BIST controller 222 is controlled from a system test unit in a manner that allows the BIST controller 222 to test the processor to which it belongs, after which the BIST controller 222 enters an idle mode until otherwise enabled. It will be appreciated, that the system test unit can be incorporated at the same integrated circuit die as BIST controller 222 or implemented external the integrated circuit die.

In response to the RBE bit being asserted and the RBC_EN bit being negated, the BIST controller 222 will exit idle mode and operate in the manner previously described to randomly modify power consumption of the integrated circuit die by continuously performing random accesses to memory of the processor at which the BIST controller 222 resides—until the RBE bit is negated.

In response to RBC_EN being asserted, the BIST controller 222 will randomly assert and negate an enable signal to generate random time slots, defined by asserted portions of the enable signal, during which BIST controller 222 is enabled. According to one embodiment, controller 222 will operate to access a memory based upon randomly generated data and addresses, as previously described, in response to bits RBC_EN and RBE being asserted contemporaneously with each other; otherwise, controller 222 will operate in an alternate manner in response bit RBC_EN being asserted contemporaneously with bit RBE being negated. For example, the alternate manner can result in the BIST controller operating in a traditional manner that occurs during normal start-up, or a predefined BIST test routine can be executed, such as a test routine that is implemented during traditional BIST testing. It will be appreciated that according to an embodiment the predefined BIST test routine can be user selectable. According to an alternate embodiment, when bit RBC_EN is asserted, it will operate to access the memory based upon randomly generated data and addresses during random time slots to access memory based upon randomly generated data and address as previously described, regardless as to the asserted/negated state of bit RBE.

Figure 6:
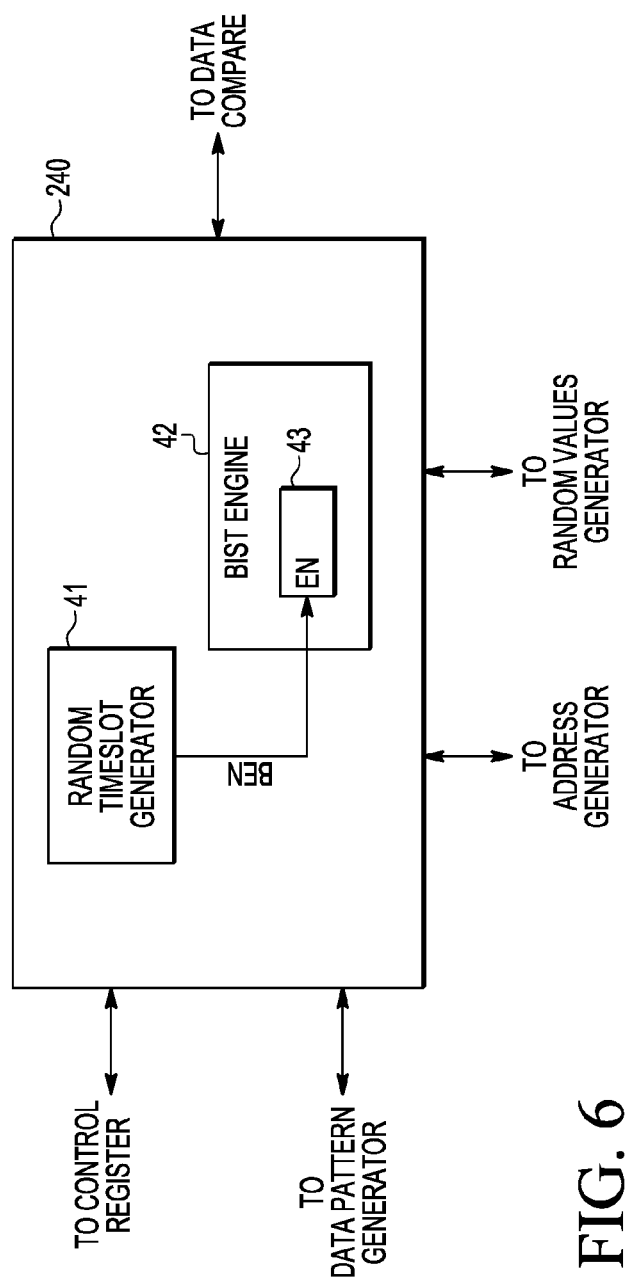
FIG. 6 is a simplified block diagram illustrating a portion of the BIST controller of FIG. 5 in accordance with a specific embodiment of the present disclosure.

FIG. 6 illustrates a particular embodiment of the BIST control unit 240 that includes a random timeslot generator 41 and a BIST engine 42 that includes a portion 43 that interfaces with the random timeslot generator 41 to control operation of the BIST control unit 240. The random timeslot generator 41 generates a signal BEN that when asserted activates BIST engine 42. For purposes of discussion, it is presumed that BIST controller 222 operates to randomly access memory in the manner as previously described in response to signal BEN being asserted. Various embodiments of the random timeslot generator 41 are illustrated in FIGS. 7-10.

Figure 7:
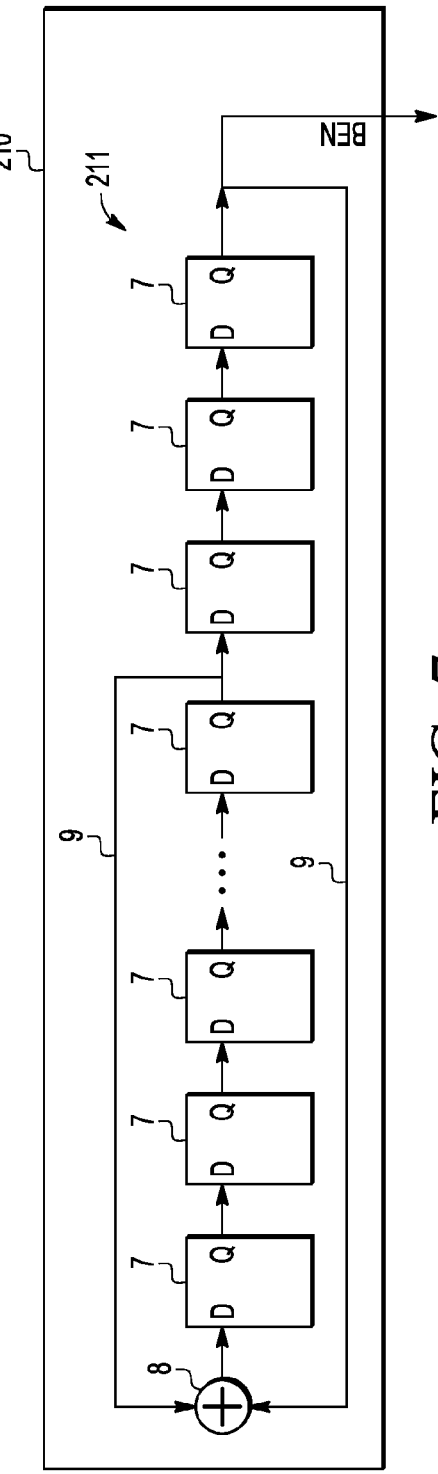
FIG. 7 is a simplified block diagram illustrating one embodiment of a random timeslot generator of FIG. 6 in accordance with a specific embodiment of the present disclosure.

FIG. 7 illustrates a particular embodiment 210 of the random timeslot generator 41 of FIG. 6. In particular, the random timeslot generator 210 includes an LFSR 211 that includes a plurality of D flip-flops 7 connected in series, with the output of two or more of the D flip-flops 7 fed back via interconnects 9 to a logic device 8 that provides a logic signal to the first D flip-flop of the series. An output of one of the D flip-flops 7 is tapped to provide the BEN signal, causing the BIST controller 222 to be activated. For purposes of discussion, it is presumed that the BEN signal is a random signal having a 50% activity factor. Thus, the timeslot generator 40 generates a control signal having an activity factor of 50% in response to LFSR 210 being enabled. The term activity factor as used herein with respect to a signal is intended to represent an activity ratio of the signal in percentage form; wherein the term activity ratio as used herein is intended to mean the expected ratio between the sum of the asserted portions of a signal during a sufficiently long time period and the duration of the sufficiently long time period during which time it is likely the signal will be asserted and negated multiple times. It will be appreciated, that with respect to a randomly generated signal that the total amount of time over which an expected activity factor occurs can vary due to the random nature of the signal. Thus an activity ratio of 1:2 (0.5) corresponds to an activity factor of 50%.

Figure 8:
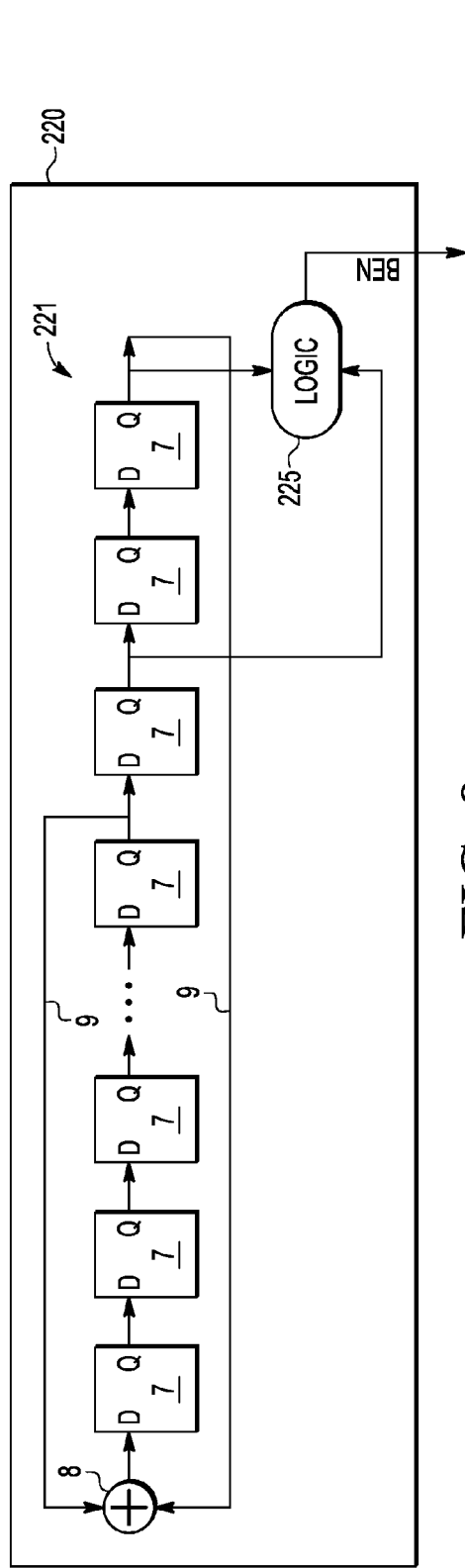
FIG. 8 is a simplified block diagram illustrating one embodiment of a random timeslot generator of FIG. 6 in accordance with a specific embodiment of the present disclosure.

FIG. 8 illustrates a particular embodiment 220 of the random timeslot generator 41 of FIG. 6. In particular, the random timeslot generator 220 includes an LFSR 221 having a plurality of D flip-flops 7 connected in series, with the output of two or more of the D flip-flops fed back via interconnects 9 to a logic operation 8 that provides a logic signal to a first D flip-flop 7 of the series. Two of the D flip-flops 7 are tapped to provide signals to a second logic device 225 that generates the BEN signal. For purposes of discussion, it is presumed that the LFSR taps provides to the logic device 225 are random signals each having a 50% activity factor. The activity factor of the signal BEN can vary based upon the selected logic device 225, and based upon the number of LFSR taps provided to the logic device 225. For example, if logic device 225 is a 2-input OR gate that is connected to two taps of LFSR 221, the signal BEN will have a activity factor of 75%. Alternatively, if logic device 225 is a 2-input AND gate that is connected to two taps of LFSR 221, the signal BEN will have a activity factor of 25%.

Figure 9:
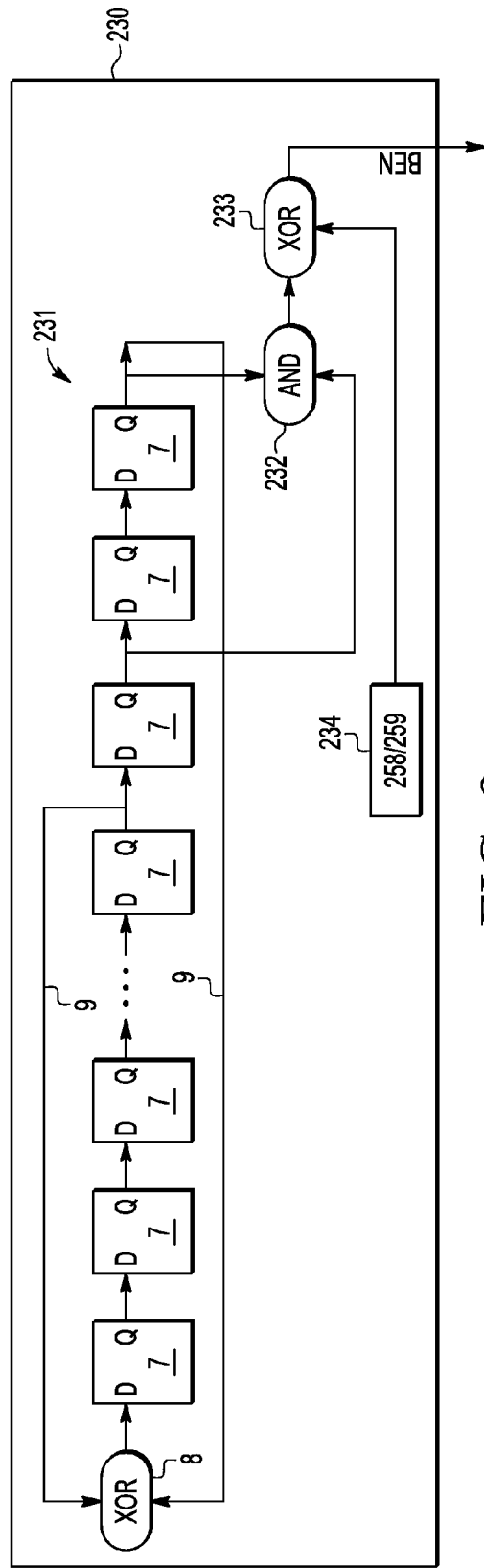
FIG. 9 is a simplified block diagram illustrating one embodiment of a random timeslot generator of FIG. 6 in accordance with a specific embodiment of the present disclosure.

FIG. 9 illustrates a particular embodiment 230 of the random timeslot generator 41 of FIG. 6. In particular, the random timeslot generator 230 includes an LFSR 231 having a plurality of D flip-flops 7 connected in series, with the output of two or more flip-flops 7 fed back via interconnects 9 to an exclusive-or gate 8. Two of the D flip-flops 7 have their outputs connected to an AND gate 232. The resulting activity factor at the output of AND gate 232 is 25%, presuming that LFSR 231 provides taps having activity factors of 50% to the inputs of AND gate 232. The output of AND gate 232 is connected to an input of a XOR gate 233. The second input of XOR gate 233 receives a logic signal based upon a logic bit stored at register location 234. In response to the logic bit stored at register location 234 being a logic zero, the BEN signal will have a activity factor of 25%. Alternatively, in response to the logic bit stored at register location 234 being a logic one, the BEN signal will have an activity factor of 75%. In this manner, the activity factor can be user programmable. It will be appreciated, that additional taps, and logic can be used in order to provide greater user control over the selected activity factor as illustrated in the embodiment of FIG. 10.

Figure 10:
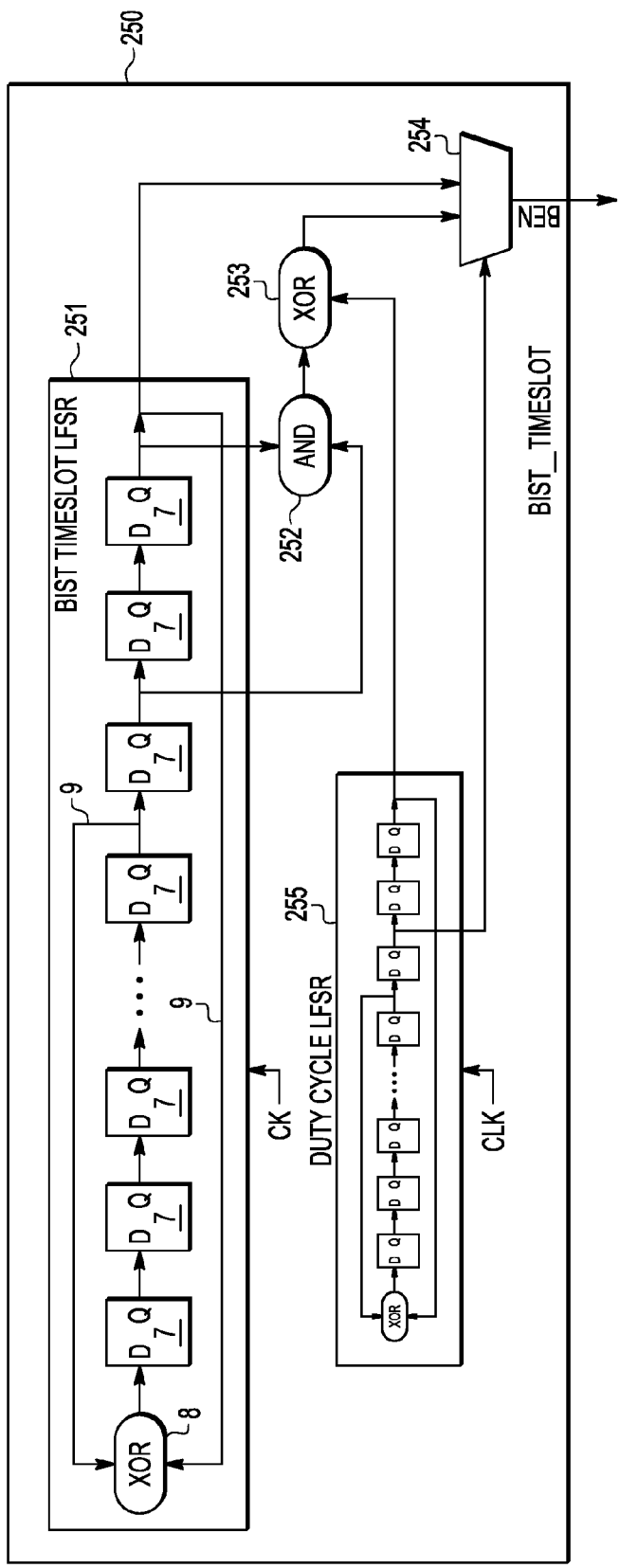
FIG. 10 is a simplified block diagram illustrating one embodiment of a random timeslot generator of FIG. 6 in accordance with a specific embodiment of the present disclosure.

FIG. 10 illustrates a particular embodiment 240 of the random timeslot generator 41 of FIG. 6, wherein the specified activity factor of the BEN signal changes in a random manner. In FIG. 10, LFSR 241 corresponds to LFSR 231 of FIG. 9, AND gate 241 corresponds to AND gate 232 of FIG. 9, and XOR gate 242 corresponds to XOR gate 233 of FIG. 9. However, instead of the second input of XOR 242 being connected to a user programmable register, the input of XOR gate 242 is connected to an output of a second LFSR 245 that provides a random signal. The activity factor generated at the output of XOR 242 is the same as the activity factor at AND gate 241, e.g., 75%, in response to the LFSR 245 providing a logic one to XOR gate 242; otherwise, the activity factor generated at the output of XOR 242 is inverted, e.g., 25%, in response to LFSR 245 providing a logic zero to XOR gate 242. The output of XOR gate 242 is connected to a first select input of a select module 244, which is illustrated as a multiplexor, and the output of one of the D flip-flops 7 having a 50% activity factor is connected to a second select input of the select module 244. An output of the LFSR 245 selects which one of the select inputs of the select module 244 is provided as the BEN signal. This results in the BEN signal having a particular activity factor for a random amount of time. According to an embodiment, the LFSR 245 can have a clock that is significantly slower than a clock provided to LFSR 241. For example, the clock SCK can be an order of magnitude or more slower than that of the clock CK.

Figure 11:
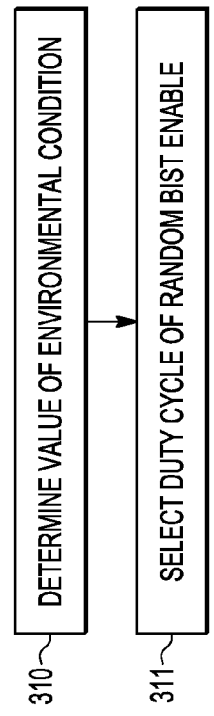
FIG. 11 is a simplified flow diagram illustrating a process for generating a random power consumption profile according to an embodiment of the present disclosure.

FIG. 11 illustrates a flow diagram of a method in accordance with a particular embodiment of the present disclosure. At block 310 an environmental condition at an integrated circuit die is determined. Examples of various environmental conditions include temperature, voltage, current, the like, and combinations thereof. At block 311, a particular activity factor for the randomly generated enable signal is selected by an activity factor select module (not shown) based upon the environmental condition. For example, according to an embodiment the higher a temperature detected at a location of the integrated circuit die, the lower the desired activity ratio; thereby reducing the amount of time that the BIST controller 222 is operational, while maintaining random power dissipation to obfuscate the power being used by a secure operation. Since in some embodiments, BIST operation may result in above average power dissipation, it may be desirable to monitor one or more environmental conditions in order to maintain a safe operating condition. According to an embodiment, an activity factor select module can monitor the environmental condition, and provide appropriate activity factor select values to control logic, such as to exclusive or gate 242, and to multiplexor 244.

Figure 12:
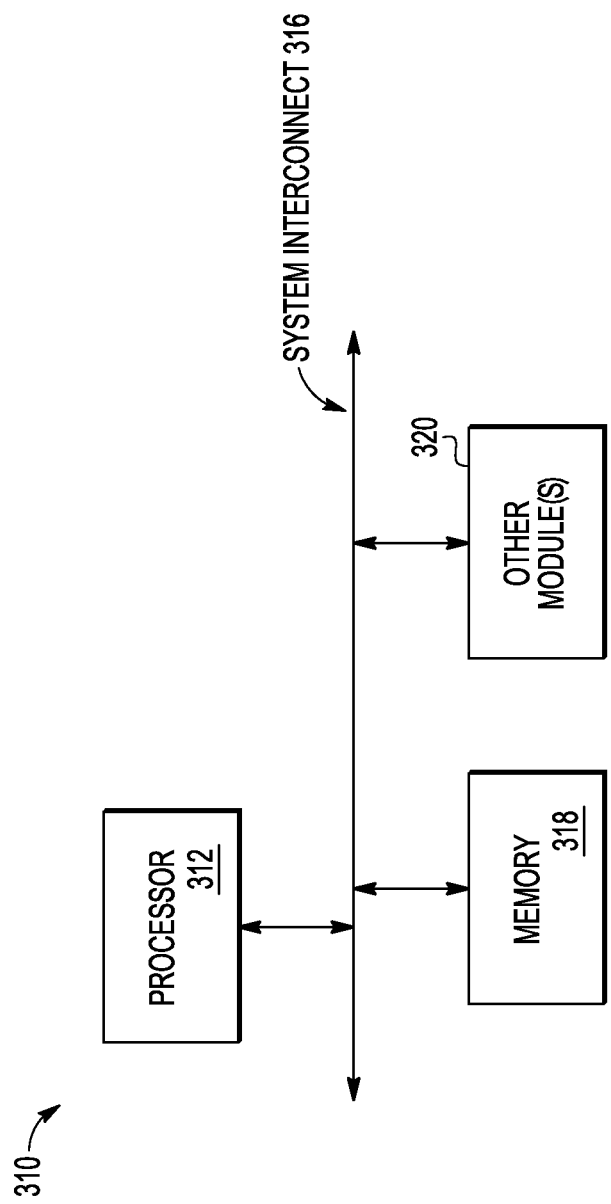
FIG. 12 is a simplified block diagram illustrating another example of a data processing system usable with embodiments of the present disclosure.

FIG. 12 is a simplified block diagram illustrating another example of a system device referred to herein as system 310 that includes a data processing system that includes a single processor 312 that is bidirectionally connected to a system interconnect 316. System interconnect 316 provides communication between the processor 312 and memory 318 and other modules 320 (e.g., peripherals, input/output devices and the like). System interconnect 316, memory 318, and other modules 320 can be implemented in the same manner as interconnect 16, memory 18 (FIG. 1), and other modules 20, respectively.

Figure 13:
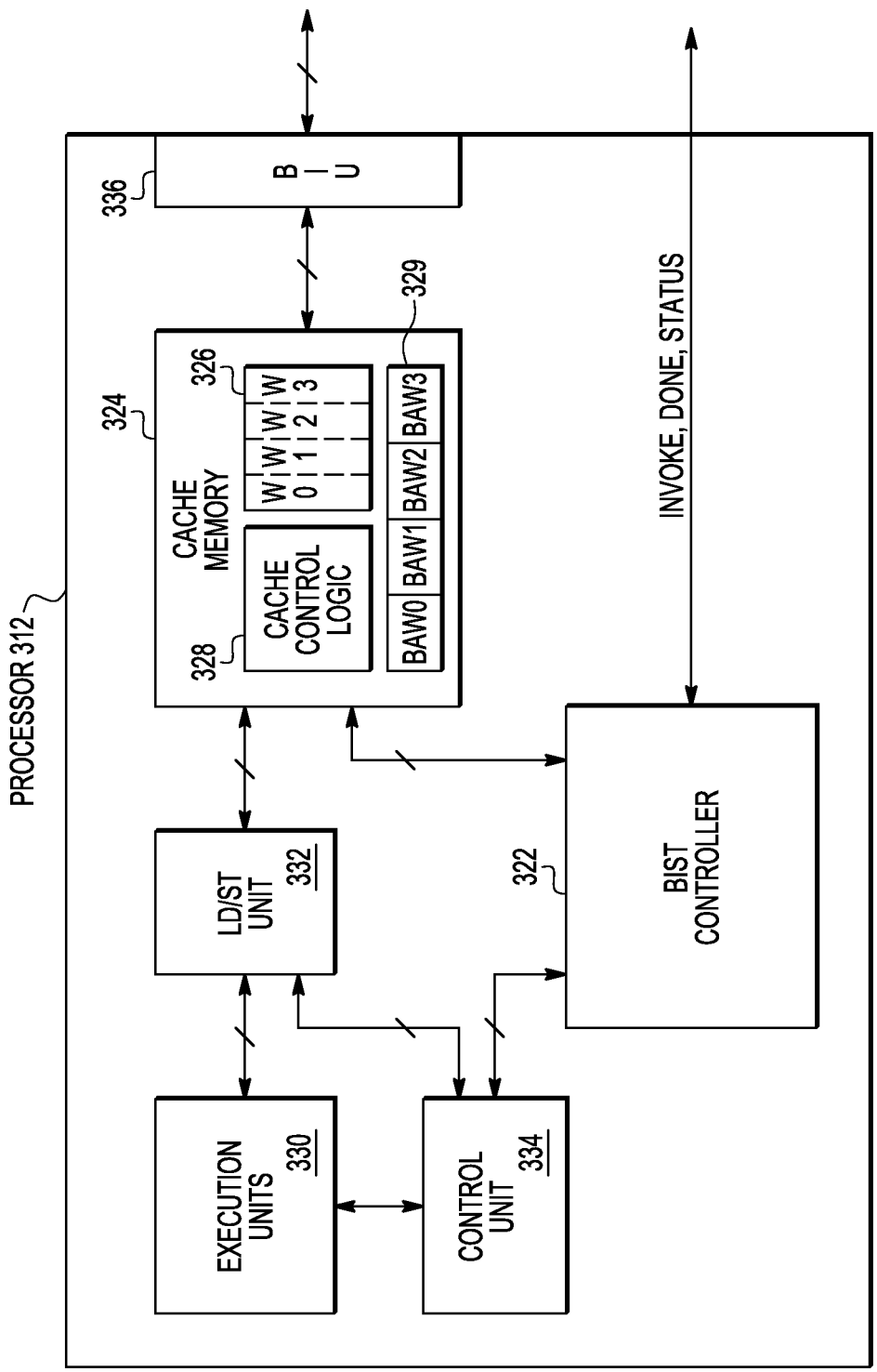
FIG. 13 is a simplified block diagram illustrating an example of a processor incorporating a BIST controller according to an embodiment of FIG. 12.

FIG. 13 is a simplified block diagram illustrating one example of a processor 312 incorporating cache memory and a BIST controller according to embodiments of the present disclosure. According to an embodiment, processor 312 can be an instruction based-processor that includes one or more execution units 330 that can execute fetched instructions. Execution units 330 are connected to load/store (LD/ST) unit 332, which is connected to cache memory 324 and to control unit 334. Control unit 334 is also connected to execution units 330 and to BIST controller 322. Control unit 334 directs operations of components of processor 312. In particular, processor 312 includes a cache memory 324 connected to a BIST controller 322 and to a load LD/ST unit 332. The cache memory 324 can be connected to the LD/ST unit 332 and BIST controller 322 via a common interface, or the cache memory 324 can be a multi-port cache memory, wherein the LD/ST unit 332 is connected to one port of cache memory 324 and the BIST controller 322 is connected to a different port of cache memory 324. For purposes of discussion, it is presumed that the cache memory 324 is a multi-port cache and that the LD/ST unit 332 and the BIST controller 322 are connected to different ports, thus allowing concurrent accesses to cache memory 324.

BIST controller 322 can be configured to perform both traditional BIST memory access functions related to memory testing as well as perform random memory access functions that can be used to cause a random power profile during secure code operations by processor 312 of system 310. In particular, BIST control 322 can be configured to implement any of the random access features described above with respect to BIST controller 122 and BIST controller 222.

According to an embodiment, the cache memory 324 can be partitioned by the user to dedicate a portion of the cache memory 324 to service accesses from the BIST controller 322. For purposes of discussion, it is presumed that cache control logic 328 implements cache memory 324 as a multi-way cache. As particularly illustrated, cache memory 324 has ways W0-W3 as indicated at memory array 326.

During normal operation, when there is no need to obfuscate power consumption, the ways W0-W1 are allocated such that by the cache control logic 328 services the execution units 330 using all four ways. However, when need be, the cache memory 324 can be configured to allow one or more of the multiple ways to be dedicated to the BIST controller 322 of processor 312, thereby allowing the BIST controller to access a portion of the cache in a random manner that obfuscates the power being consumed by other portions of the processor 312. This can be useful when the execution units 330 are executing a security sensitive sequence of code, such as code that implements and encryption or decryption process.

In the particular embodiment illustrated at FIG. 13, the cache control logic 328 has access to a storage location 329, illustrated as a control register 329, that includes a bit labeled BAW0, a bit labeled BAW1, a bit labeled BAW2, and a bit labeled BAW4. Bits BAW0-BAW3 are user programmable locations that correspond one-to-one to respective ways W0-W3 of the cache memory 324, where an asserted bit at one of the locations BAW0-BAW3 indicates that its corresponding way W0-W3 is allocated to servicing BIST controller 322. In an embodiment, the dedication of a way to service the BIST controller 322 occurs further in response to RBE being asserted, as previously described at FIG. 4. The bits BAW0-BAW3 bit can be set by instructions executed at execution units 330, e.g., bits BAW0-BAW3 store user programmable enable values.

Thus, when the BIST controller 322 is enabled to provide randomly generated access requests to the cache memory 324, in one or more of the manners previously described, the cache control logic 328 will read the bits BAW0-BAW3 to identify that portion of the cache memory 324 that will service the random access requests, e.g., will identify those ways having their corresponding bit BAW0-BAW3 asserted. Further, operation of execution units 330 continues, e.g., the processor 312 continues to fetch and execute instructions in a normal manner, however, only those ways having their corresponding bits BAW0-BAW3 negated will be available to service the execution units 330. According to an embodiment, those cache ways having their corresponding bits BAW0-BAW3 negated are dedicated to the execution units 330. Thus, there are a plurality of possible valid indicators values that can be stored at bits BAW0-BAW3. For example, a binary value of 1000 would be an indicator that only way W0 is to service the random accesses, while a binary value of 1010 would be an indicator that ways W0 and W2 are both used to service the random accesses.

It will be appreciated that in an alternate embodiment, a multi-core processor can be configured having multiple cores of the type described at FIGS. 12 and 13. Thus, allowing each individual processor of a multi-core system to control when a BIST controller randomly accesses the portions(s) of its own cache, while continuing to fetch and execute instructions with the support of the portion(s) of its cache that is not dedicated to the BIST controller. Thus, each processor of a multi-processor system can control the manner that it obfuscates its power consumption by identifying particular cache ways of its dedicated cache that are to be dedicated to servicing random BIST accesses, and by enabling the random accesses. In this manner, the execution units and the BIST controller can both provide access requests to the cache memory for concurrent servicing.

In a first aspect, a method can include identifying during operation of an integrated circuit a first portion of a cache memory for servicing access requests from a random access generator, and identifying a second portion of the cache memory that cannot service access requests from the random access generator. The method can also include executing a security sensitive operation at a processor core that can include the cache memory, and in response to being identified, using the first portion of the cache memory to service access requests generated by the random access generator during execution of the security sensitive operation.

In one embodiment of the first aspect, the processor core is an instruction-based processor core of an integrated circuit die having a single processor core. In another embodiment, the processor core is a first core of an integrated circuit die having multiple instruction-based processor cores. In a further embodiment, the cache memory is dedicated to the first core. In an even further embodiment, the random access generator is implemented with built-in self-test hardware that includes a random number generator to provide random number to randomize a characteristic of the access requests. In yet another embodiment, executing the security sensitive operation includes executing a fetched instruction at an execution unit of the processor core, and further includes storing at the second portion of the cache memory at least one of the fetched instruction and operand data of the security sensitive operation.

In another embodiment of the first aspect, in response to being identified, the first portion of the cache is not available to service access requests of the execution unit. In a further embodiment, identifying the first portion of the cache comprises reading an enable indicator from a user programmable location. In still another embodiment, the enable indicator is one of a plurality of valid indicators, each valid indicator identifying one or more ways of the cache as the first portion, including a first indicator that identifies the first portion to be exactly one way of a cache, and a second indicator that identifies the first portion to be two or more ways of the cache. In a particular embodiment, the first portion is a first way of a plurality of ways of the cache memory. In a more particular embodiment, servicing the access requests during execution of the security sensitive operation includes servicing the access requests and executing of the security sensitive operation occurring concurrently. In an even more particular embodiment, the service access request generated by the random access generator includes a write access request that is serviced by the cache memory.

In a second aspect, the integrated circuit device can include an execution module capable of performing security sensitive operations, a cache memory comprising a plurality of portions, and a user programmable first storage location coupled to the cache to store an enable indicator. The device can also include a cache access module coupled to the cache memory to operate concurrently with the execution module executing a security sensitive operation to randomly access selected portions of the plurality of portions as defined by an indicator, wherein unselected portions of the plurality of portions are not able to be randomly accessed.

In one embodiment of the second aspect, the cache memory comprises a plurality of ways, and each portion of the plurality of portions includes at least one way of the cache memory. In another embodiment, the security sensitive module includes a data processor core that is an instruction-based data processor core, and the cache memory is dedicated to the data processor core. In a further embodiment, the cache access module randomly accesses selected portions of the plurality of portions using a built-in self-test module that randomizes at least one of an address of a write access request, and a data of the write access request.

In a third aspect, the method can include identifying a first portion of a cache memory during operation of an integrated circuit, and executing a security sensitive operation at an execution unit of a processor core, wherein information related to the security sensitive operation is provided to the execution unit via the cache memory. The method can also include randomly accessing the first portion of the cache, in response to being identified, during execution of the security sensitive operation.

In one embodiment of the third aspect, the core is a first processor core of an integrated circuit die having a plurality of cores including the first core, the cache being dedicated to the first core. In another embodiment, the information related to the security sensitive operation that is provided to the execution unit includes storing at the cache memory at least one instruction of the security sensitive operation or operand data of the security sensitive operation at a location of the cache memory other than the first portion. In yet another embodiment, the method includes further using built-in self-test hardware to randomly access the first portion of the cache. In still another embodiment, the first portion of the cache memory is not accessible by the security sensitive operation. In a further embodiment, accessing the cache in response to executing the security sensitive operation includes accessing one or more of the first portion of the cache and a portion of the cache other than the first portion, wherein the portion of the cache other than the first portion is not accessible for the randomly accessing.

In a particular embodiment of the third aspect, the method includes randomly accessing the first portion is in response to a user provided indicator being asserted. In a more particular embodiment, the first portion is identified by a user via software control. In an even more particular embodiment, the first portion is a first way of a plurality of ways of the data processor. In another embodiment, the processor core is the only general purpose instruction-based processor of the integrated circuit die.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Any benefits, advantages, or solutions to problems that are described herein with regard to specific embodiments are not intended to be construed as a critical, required, or essential feature or element of any or all the claims.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Thus, it is to be understood that the architectures depicted herein are merely exemplary, and that in fact many other architectures can be implemented which achieve the same functionality. For example, in one embodiment, the illustrated elements of system 10 are circuitry located on a single integrated circuit or within a same device. Alternatively, system 10 may include any number of separate integrated circuits or separate devices interconnected with each other. For example, memory 18 may be located on a same integrated circuit as masters 12 and 14 or on a separate integrated circuit or located within another peripheral or slave discretely separate from other elements of system 10. Other modules 20 and can also be located on the same integrated circuit as one or more of the processors 12 and memory 18. Also for example, various portions of system 10 may be implemented using physical circuitry that includes an execution unit and associated memory locations storing instructions executed by the execution unit; alternatively system 10 and portions thereof may be implemented as physical circuitry in form of a non-instruction based state machine. As such, system 10 may be embodied in a hardware description language of any appropriate type that identifies features that define an integrated circuit design definition to which integrated circuits are ultimately manufactured.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process.

The term "coupled," as used herein, is not intended to be limited to a direct connection or a mechanical coupling.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

What is claimed is:

1. A method comprising:
    identifying during non-built-in-self-test (non-BIST) operation of an integrated circuit a first portion of a cache memory for servicing access requests from a random access generator, and identifying a second portion of the cache memory that cannot service access requests from the random access generator, wherein the random access generator is implemented with built-in self-test hardware that includes a random number generator to test memory locations of an integrated circuit during a BIST operation using random numbers, and wherein the non-BIST operation is not related to testing of the cache memory;
determining during the non-BIST operation, that a security sensitive operation is to be executed at a processor core that includes the cache memory; and
in response to determining that the security sensitive operation is to be executed, using the first portion of the cache memory during non-BIST operation to service access requests generated by the random access generator during execution of the security sensitive operation.

2. The method of claim 1, wherein the processor core is an instruction-based processor core of an integrated circuit die having a single processor core.

3. The method of claim 1, wherein the processor core is a first core of an integrated circuit die having multiple instruction-based processor cores.

4. The method of claim 3, wherein the cache memory is dedicated to the first core.

5. The method of claim 1, wherein the random access generator is implemented with built-in self-test hardware that includes a random number generator to provide a random number to randomize a characteristic of the access requests.

6. The method of claim 1 further comprising: executing the security sensitive operation, wherein executing the security sensitive operation, includes executing a fetched instruction at an execution unit of the processor core, and further includes storing at the second portion of the cache memory at least one of the fetched instruction and operand data of the security sensitive operation.

7. The method of claim 6, wherein, in response to being identified, the first portion of the cache is not available to service access requests of the execution unit.

8. The method of claim 1 further comprising:
writing an enable indicator at a user programmable location by the processor core during non-BIST operation, wherein identifying the first portion of the cache comprises reading the enable indicator from the user programmable location.

9. The method of claim 8, wherein the enable indicator is one of a plurality of valid indicators, each valid indicator identifying one or more ways of the cache as the first portion, including a first indicator that identifies the first portion to be exactly one way of a cache, and a second indicator that identifies the first portion to be two or more ways of the cache.

10. The method of claim 1, wherein servicing the access requests during execution of the security sensitive operation includes servicing the access requests and executing of the security sensitive operation occurring concurrently.

11. The method of claim 1 wherein servicing an access request generated by the random access generator includes a write access request that is serviced by the cache memory.

12. An integrated circuit die device comprising:
an execution module capable of performing security sensitive operations;
a cache memory comprising a plurality of portions;
a user programmable first storage location coupled to the cache to store an enable indicator in response to software executed by the execution module;
a built-in self-test (BIST) controller including a random number generator to test memory locations of an integrated circuit during BIST using random numbers
a cache access module coupled to the cache memory to operate, in response to the first storage location storing the enable indicator, concurrently with the execution module executing a security sensitive operation to randomly access selected portions of the plurality of portions as defined by an indicator,
wherein unselected portions of the plurality of portions are not able to be randomly accessed,
randomly accessing the first portion of the cache, in response to being identified, during execution of the security sensitive operation,
wherein the randomly accessing uses random numbers generated by the random number generator of the BIST circuitry during a non-BIST operation, the non-BIST operation not being related to testing of the cache memory.

13. The device of claim 12 wherein the cache memory comprises a plurality of ways, and each portion of the plurality of portions includes at least one way of the cache memory.

14. The device of claim 12, wherein the executions module includes a data processor core that is an instruction-based data processor core, and the cache memory is dedicated to the data processor core.

15. The device of claim 12, wherein the cache access module randomly accesses selected portions of the plurality of portions using a built-in self-test module that randomizes at least one of an address of a write access request, and a data of the write access request.

16. A method comprising:
testing memory locations of an integrated circuit during Built-In-Self-Test (BIST) using random numbers generated by a random number generator of a BIST controller;
identifying a first portion of a cache memory during non-Built-In-Self-Test (BIST) operation of an integrated circuit, wherein the non-BIST operation is not related to testing of cache memory;
during non-BIST operation, executing a security sensitive operation at an execution unit of a processor core during the non-BIST operation, wherein information related to the security sensitive operation is provided to the execution unit via the cache memory; and
randomly accessing the first portion of the cache, in response to being identified, during execution of the security sensitive operation, wherein the randomly accessing uses random numbers generated by the random number generator of the BIST circuitry during the non-BIST operation.

17. The method of claim 16, wherein the core is a first processor core of an integrated circuit die having a plurality of cores including the first core, the cache being dedicated to the first core.

18. The method of claim 16, wherein the information related to the security sensitive operation that is provided to the execution unit includes storing at the cache memory at least one instruction of the security sensitive operation or operand data of the security sensitive operation at a location of the cache memory other than the first portion.

19. The method of claim 1 further comprising stopping use of the first portion of the cache memory to service access requests generated by the random access generator during normal operation in response to completion of the security sensitive operation.

20. The method of claim 1, wherein the security sensitive operation is at least one of an encryption operation and a decryption operation.

* * * * *